(12) United States Patent
Eide

(10) Patent No.: US 7,242,082 B2
(45) Date of Patent: Jul. 10, 2007

(54) STACKABLE LAYER CONTAINING BALL GRID ARRAY PACKAGE

(75) Inventor: Floyd Eide, Huntington Beach, CA (US)

(73) Assignee: Irvine Sensors Corp., Costa Mesa, CA (US)

( * ) Notice: Subject to any disclaimer, the term of this patent is extended or adjusted under 35 U.S.C. 154(b) by 126 days.

(21) Appl. No.: 11/229,351

(22) Filed: Sep. 15, 2005

(65) Prior Publication Data

US 2006/0055039 A1    Mar. 16, 2006

Related U.S. Application Data

(63) Continuation of application No. 10/360,244, filed on Feb. 7, 2003, now Pat. No. 6,967,411.

(60) Provisional application No. 60/355,955, filed on Feb. 12, 2002, provisional application No. 60/354,442, filed on Feb. 7, 2002.

(51) Int. Cl.
*H01L 23/48* (2006.01)
*H01L 23/52* (2006.01)

(52) U.S. Cl. .................. 257/690; 257/693; 257/773; 257/776; 257/780; 257/781; 257/784; 257/E23.001

(58) Field of Classification Search ........ 257/678–739, 257/750, 773, 776, 777, 787–796, E25.006, 257/E25.013, E25.018, E25.021, E25.27, 257/E23.085, E21.614

See application file for complete search history.

(56) References Cited

U.S. PATENT DOCUMENTS

| | | | |
|---|---|---|---|
| 5,696,031 A | 12/1997 | Wark | |
| 5,973,403 A | 10/1999 | Wark | |
| 6,081,026 A | 6/2000 | Wang | |
| 6,303,992 B1 * | 10/2001 | Van Pham et al. | 257/734 |
| 6,323,060 B1 | 11/2001 | Isaak | |
| 6,365,978 B1 * | 4/2002 | Ibnabdeljalil et al. | 257/786 |
| 6,639,416 B1 | 10/2003 | Akram | |
| 6,787,921 B2 * | 9/2004 | Huang | 257/778 |
| 6,818,977 B2 | 11/2004 | Poo | |
| 6,967,411 B2 | 11/2005 | Eide | |
| 2002/0048849 A1 | 4/2002 | Isaak | |
| 2002/0061665 A1 | 5/2002 | Batinovich | |
| 2002/0076919 A1 | 6/2002 | Peters | |
| 2002/0105083 A1 | 8/2002 | Sun | |
| 2003/0173673 A1 | 9/2003 | Val | |
| 2003/0232460 A1 | 12/2003 | Poo | |
| 2004/0012078 A1 | 1/2004 | Hortaleza | |

* cited by examiner

*Primary Examiner*—Jasmine Clark
(74) *Attorney, Agent, or Firm*—W. Eric Boyd, Esq.

(57) ABSTRACT

Layers suitable for stacking in three dimensional, multi-layer modules are formed by interconnecting a ball grid array electronic package to an interposer layer which routes electronic signals to an access plane. The layers are underfilled and may be bonded together to form a stack of layers. The leads on the access plane are interconnected among layers to form a high-density electronic package.

4 Claims, 2 Drawing Sheets

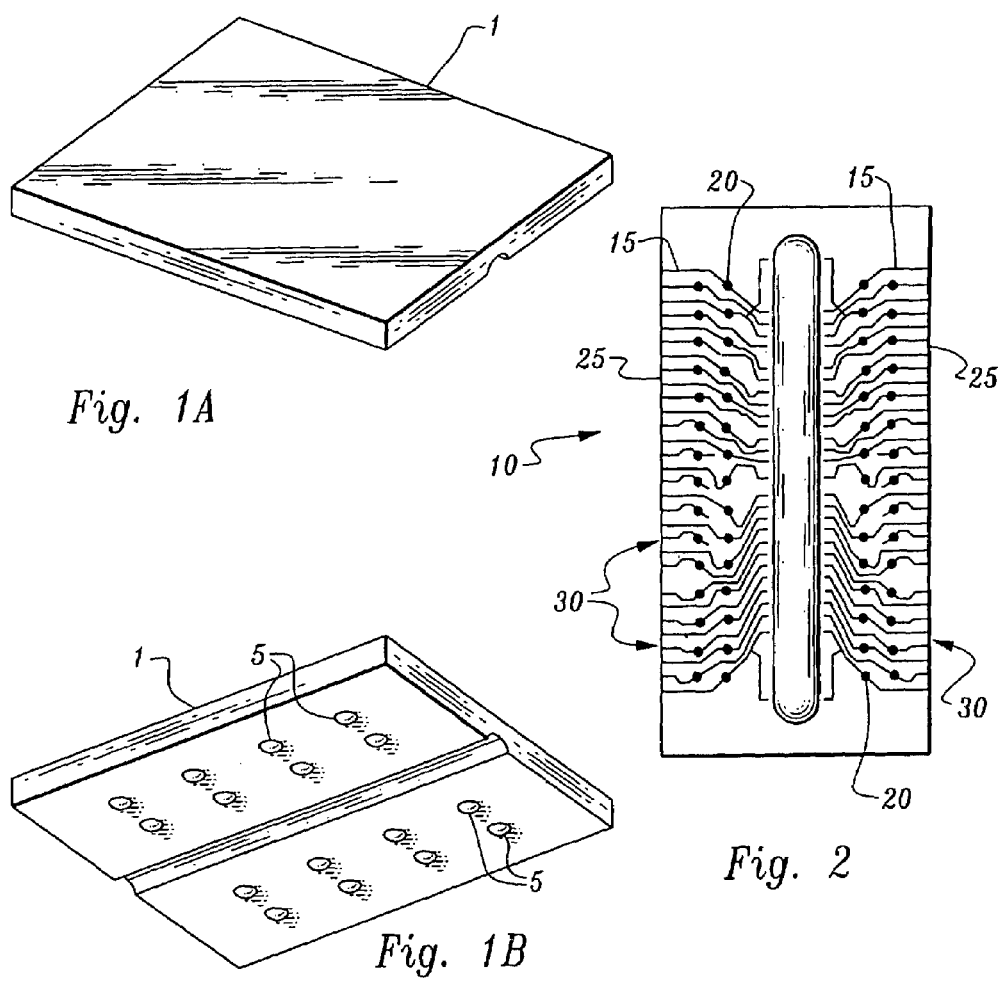
Fig. 1A
Fig. 1B
Fig. 2
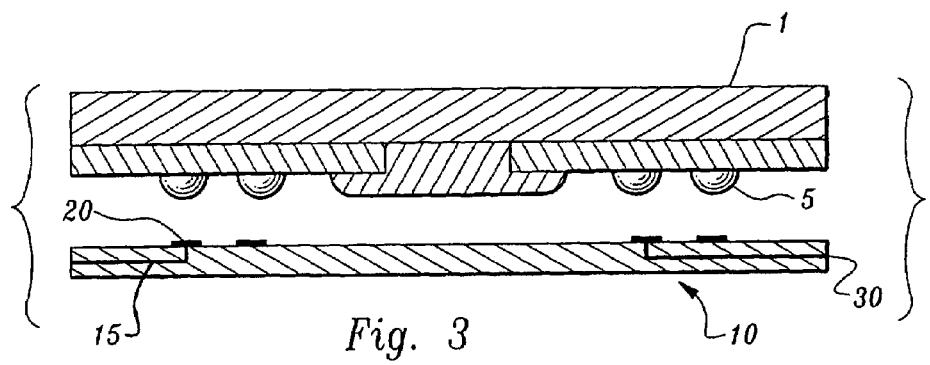
Fig. 3

STACKABLE LAYER CONTAINING BALL GRID ARRAY PACKAGE

REFERENCE TO RELATED APPLICATIONS

This application is a continuation of U.S. patent application Ser. No. 10/360,244 filed Feb. 7, 2003, U.S. Pat. No. 6,967,411, entitled "Stackable Layers Containing Ball Grid Array Packages", which in turn claims priority to provisional application No. 60/354,442 filed Feb. 7, 2002 and provisional application No. 60/355,955 filed Feb. 12, 2002.

BACKGROUND OF THE INVENTION

1. Field of the Invention

The present invention relates to the dense packaging of electronic circuitry and specifically to the stacking of ball grid array (BGA) integrated circuit packages. The invention is also suitable for the stacking of fine ball grid array (FBGA) integrated circuit packages, micro-ball grid array packages and for bump-bonded bare die to form stackable layers which can be combined to form multi-layer electronic modules.

2. Description of the Background Art

The electronics industry continues to seek smaller, denser electronic packaging. An important advance in this regard has been the use of three-dimensional packaging techniques using stacked bare or packaged integrated circuit die.

Most of the background art disclosures describe methods of stacking multiple unpackaged IC chips. Oguchi et al., U.S. Pat. No. 5,332,922, Miyano et al., U.S. Pat. No. 5,440,171, and Choi et al., U.S. Pat. No. 5,677,569, disclose methods of stacking IC chips within a single package. Jeong et al., U.S. Pat. No. 5,744,827, discloses a new type of custom chip packaging which permits stacking, but which does not allow the use of off-the-shelf packaged IC's. Burns, U.S. Pat. No. 5,484,959, shows a method of stacking TSOP packages which requires multiple leadframes attached above and below each TSOP and a system of vertical bus-bar interconnections, but which does not conveniently allow an expansion of the number of vertically interconnecting leads.

The assignee of this application, Irvine Sensors Corporation, has been a leader in developing high-density packaging of IC chips, for use in focal plane modules and for use in a variety of computer functions such as electronic memory. Examples of Irvine Sensors Corp.'s high-density electronic packaging are disclosed in U.S. Pat. No. 4,672,737, to Carson, et al.; U.S. Pat. No. 5,551,629, to Carson et al.; U.S. Pat. No. 5,688,721, to Johnson; U.S. Pat. No. 5,347,428 to Carson, et al.; and U.S. Pat. No. 6,028,352 to Eide, all of which are fully incorporated herein.

The present invention relates to the stacking of layers containing integrated circuit chips (ICs), thereby obtaining high-density electronic circuitry. In general, the goal of the present invention is to combine high circuit density with reasonable cost. A unique aspect of this invention is that it provides a low cost method of stacking commercially available IC's in BGA packages while allowing the independent routing of several non-common I/O (input/output) signals from upper-level layers to lower layers or to the bottom of the stack. Cost reduction is accomplished by utilizing relatively low cost interposer boards to reroute leads to an access plane and by the ability to stack pre-packaged and pre-tested off-the-shelf BGA packages.

None of the background art addresses the need for compact, dense memory stacks that take advantage of the high speed and small outline of a BGA package that are both low cost and highly reliable. It is therefore an object of the invention to provide a stackable layer formed from a BGA package that can be assembled at a relatively low cost and which is structurally and thermally sound. It is a further object of the invention to provide a stack of BGA layers that can provide high electronic density in a very small volume and which is compatible with a conventional BGA footprint on a printed circuit board. It is yet a further object of the invention to provide a low-cost method for manufacturing a stackable layer incorporating a BGA package and a method for manufacturing a stack of such layers.

SUMMARY OF THE INVENTION

The present invention provides stackable layers which may be interconnected to form a high-density electronic module. This application further discloses a stack of layers electrically interconnected in the vertical direction, suitable for mounting onto a PCB (printed circuit board) or other electronic device. This application further discloses a method for starting with standard BGA packages and manufacturing a stacked IC-containing package using interposer interconnections which are routed in the vertical direction along one or more access planes.

The invention generally consists of BGA packaged die that are electrically interconnected to conductive traces on an interposer board formed from a dielectric material. The interposer board serves to reroute electronic signals from the BGA to the periphery, or access edge, of the interposer. The interposer may have a single layer or multiple layers of conductive traces much like conventional printed circuit board technology.

The BGA package is solder-reflowed to the interposer and under-filled with an epoxy to form a stackable layer. The formed individual layers may then be aligned and bonded to form a multi-layer structure which includes at least one access plane. The conductive traces that terminate at the access edges are lapped and exposed, then rerouted to the desired locations to allow the interconnection of several non-common signals (e.g., chip enable and/or data lines) from an upper layer to a lower layer of a stack of layers.

BRIEF DESCRIPTION OF THE DRAWINGS

FIGS. 1A and 1B are a perspective view of ball grid array integrated circuit chip package illustrating, respectively, the top of the package and the ball grid array on the underside thereof;

FIG. 2 plan view of an interposer board with exemplar conductive traces, access leads and solder ball pads formed thereon;

FIG. 3 is a front sectional view of a ball grid array package and interposer board showing the conductive traces, solder balls and solder ball pads;

DETAILED DESCRIPTION OF THE INVENTION

Figure 4:
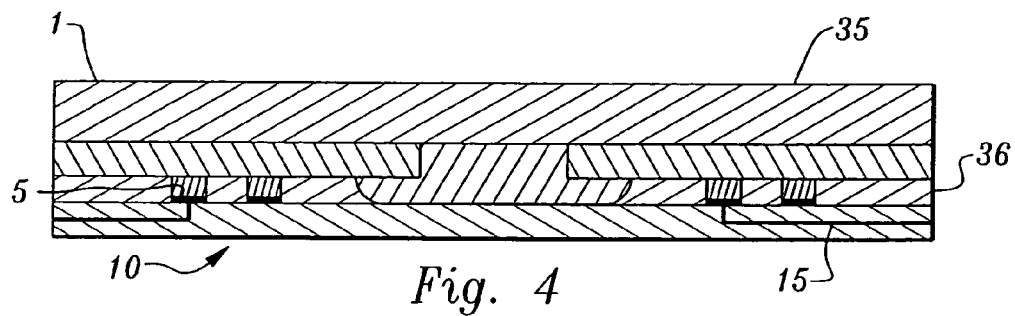
FIG. 4 is a side sectional view of a ball grid array package and interposer board after the elements have been soldered together and under-filled, creating a stackable layer.

Referring now to the figures where like numerals designate like elements among the several views, FIGS. 1A and 1B show the top and underside, respectively, of a conventional ball grid array (BGA) packaged memory device 1 which includes solder balls 5 for electrical communication of signals and power into and out of the BGA package. Conventional BGA memory packages in fine grid array or micro grid array are readily available from a variety of commercial sources such as MICRON TECHNOLOGIES, INC. or SAMSUNG CORP.

FIG. 2 illustrates an interposer board 10 made of a dielectric material such as BT Resin from Mitsubishi and includes conductive traces 15. Conductive traces 15 include solder ball pads 20 for the receiving of solder balls 5. Conductive traces lead to and terminate at an access edge 25 on the interposer board to form access leads 30.

Conductive traces made of copper or other conductive material are formed on the interposer board in a manner similar to that used in printed circuit board manufacturing. The conductive traces are patterned on the interposer board using conventional photolithography techniques so as to form solder ball pads 20 for the receiving and electrical connection of solder balls 5. The interposer board may include a single layer of conductive traces 15 or, in an alternative embodiment, multiple layers of conductive traces (not shown).

To assemble the device, solder balls 5 of BGA package 1 are aligned and electrically connected to solder ball pads 20 as is shown in FIG. 3. An alternative embodiment includes the use of fine grid BGA packages or even bare die that include ball bonds or that are adapted to be received by the solder ball pads. The BGA package and interposer board are then reflow-soldered using conventional reflow solder techniques. While the solder balls will self-align with the solder ball pads during solder reflow, reflow process controls are critical during soldering, particularly when utilizing fine pitch ball grid array packages. Solder reflow process controls such as those set forth in "MICRON TECHNOLOGY INC. Technical Note TN-00-11 SMT BGA Assembly Design Recommendations" provide guidance for BGA reflow solder processes.

Upon completion of the reflow process, a stackable BGA layer 35 is formed as is illustrated in FIG. 4. The layer is then preferably under-filled with a suitable under-fill material 36 such as EPOTEK U-300 to provide structural stability and to minimize temperature-related stresses due to CTE mismatch of the interposer board and BGA package. It is preferable to provide sufficient under-fill so as to extend slightly beyond the edge of the BGA package and interposer board as the under-fill eliminates voids along the access edge 25 which will be utilized as discussed further below.

Figure 5:
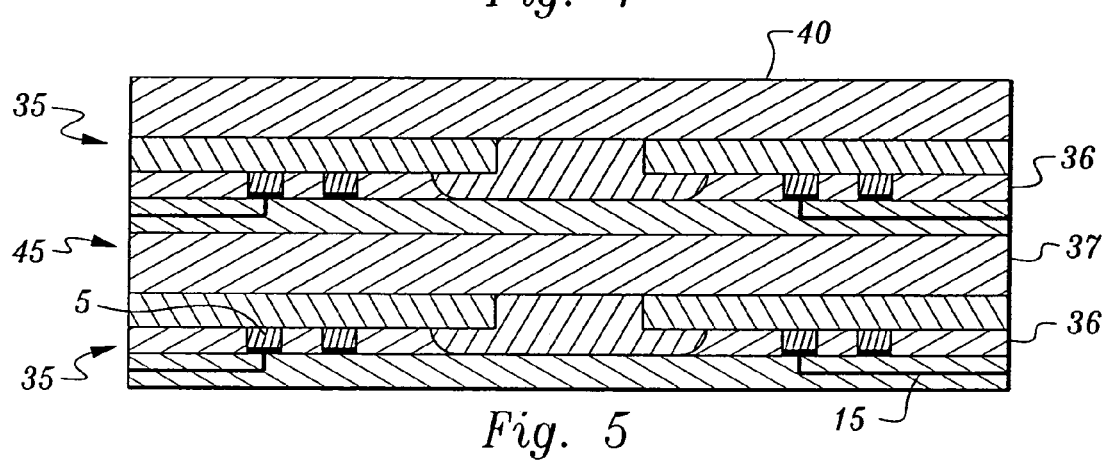
FIG. 5 is a side sectional view of a stack of layers that have been under-filled and bonded and connected a bottom interposer board.

Turning now to FIG. 5, multiple layers 35 may be bonded together using a suitable adhesive or epoxy 37 such as EPOTEK 353 to form a three-dimensional stack 40 of layers 35, forming at least one access plane 45.

Figure 6:
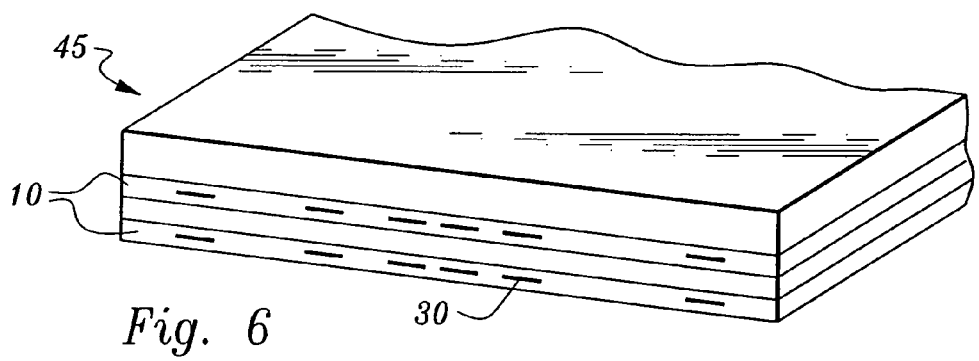
FIG. 6 shows a side view of stack of layers illustrating an access plane with access leads exposed after lapping.

Mechanical assembly of multiple layers consists generally of aligning two or more layers 35 in a suitable fixture and bonding together using the appropriate adhesive. After the adhesive has cured, the sides of stack 40 that include access leads 30, i.e., access plane 45, are ground and lapped to expose the access leads as is illustrated in FIG. 6.

Figure 7:
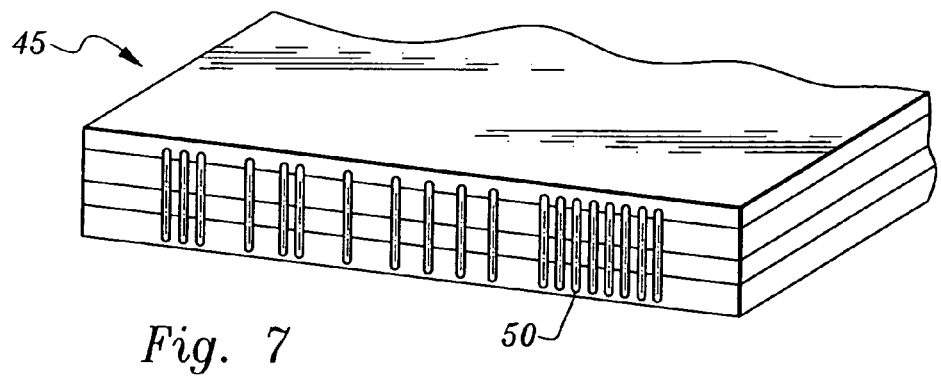
FIG. 7 shows a side view of stack of layers illustrating an access plane with access lead interconnections between access leads on different layers.

FIG. 7 shows how access leads 30 may be rerouted between layers as desired by using conventional photolithography and plating techniques to create conductive interconnecting traces 50. Alternatively, the entire access plane 45 may be metalized or coated with conductive material and the desired access leads isolated or interconnected by selectively removing conductive material using laser ablation, saw-cutting, etching or similar process. It is important that access plane be very planar with no voids to ensure the integrity of the layer interconnects. The stack is preferably encapsulated with a suitable encapsulant to protect interconnecting traces 50.

In this manner a high capacity, multi-layer module is provided that is low cost and which is readily received into existing BGA footprints.

From the foregoing description, it will be apparent the apparatus and method disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact the elements of a claim are set forth below in a certain combination, it must be expressly understood that the invention includes other combinations of fewer, more or different elements, which are disclosed above even though not claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus, if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a sub-combination or variation of a sub-combination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

I claim:

1. A stackable layer comprised of:

a BGA package comprising at least one I/O terminal on the underside thereof, an interposer layer bonded to said underside and having at least one electrically conductive trace disposed thereon in electrical connection with said at least one I/O terminal, wherein said BGA package and said interposer layer each have a lateral surface substantially coplanar with an access plane, said at least one electrically conductive trace terminating at said access plane to define an access lead, a metallized conductive trace defined on said lateral surface of said BGA package and on said interposer layer, said metallized conductive trace in electrical connection with said access lead and in electrical connection with external electronic circuitry.

2. The stackable layer of claim 1 wherein said metallized conductive trace is defined using a laser ablation process.

3. The stackable layer of claim 1 wherein said metallized conductive trace is defined using a photolithographic plating process.

4. The stackable layer of claim 1 wherein said metallized conductive trace is defined using a mechanical saw-cutting process.

* * * * *

UNITED STATES PATENT AND TRADEMARK OFFICE
CERTIFICATE OF CORRECTION

PATENT NO. : 7,242,082 B2　　　　　　　　　　　　　　　　　　　　　　　Page 1 of 1
APPLICATION NO. : 11/229351
DATED : July 10, 2007
INVENTOR(S) : Floyd Eide It is certified that error appears in the above-identified patent and that said Letters Patent is hereby corrected as shown below:

IN THE SPECIFICATION:

Column 1, Line 48: "U.S. Pat. No. 5,551,629, to Carson et al.", should read --U.S. Pat. No. 4,551,629, to Carson et al.--.

Signed and Sealed this

Tenth Day of March, 2009

JOHN DOLL
*Acting Director of the United States Patent and Trademark Office*